US006358663B2

(12) United States Patent
Kimura et al.

(10) Patent No.: US 6,358,663 B2
(45) Date of Patent: Mar. 19, 2002

(54) FLUORESCENT PATTERN, PROCESS FOR PREPARING THE SAME, ORGANIC ALKALI DEVELOPING SOLUTION FOR FORMING THE SAME, EMULSION DEVELOPING SOLUTION FOR FORMING THE SAME AND BACK PLATE FOR PLASMA DISPLAY USING THE SAME

(75) Inventors: Naoki Kimura; Seiji Tai, both of Hitachi; Hiroyuki Tanaka, Mito; Takeshi Nojiri, Ibaraki-ken; Kazuya Satou, Hitachi; Yoshiyuki Horibe, Hitachi; Mariko Shimamura, Hitachi; Toranosuke Ashizawa, Hitachinaka; Eiji Fujita; Seikichi Tanno, both of Hitachi, all of (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/755,153

(22) Filed: Jan. 8, 2001

Related U.S. Application Data

(62) Division of application No. 09/059,351, filed on Apr. 14, 1998.

(30) Foreign Application Priority Data

| | | |
|---|---|---|
| Apr. 14, 1997 | (JP) | 9-095837 |
| Aug. 4, 1997 | (JP) | 9-208996 |
| Sep. 25, 1997 | (JP) | 9-259964 |
| Nov. 21, 1997 | (JP) | 9-320646 |

(51) Int. Cl.[7] ........ G03F 7/004
(52) U.S. Cl. ........ 430/139
(58) Field of Search ........ 430/139

(56) References Cited

U.S. PATENT DOCUMENTS

| | | | | |
|---|---|---|---|---|
| 3,649,269 A | * | 3/1972 | Kubota | 430/139 |
| 3,706,558 A | * | 12/1972 | Frey | 430/139 |
| 5,858,616 A | | 1/1999 | Tanaka et al. | 430/281.1 |
| 6,168,897 B1 | * | 1/2001 | Ushirogouchi et al. | 430/139 |

FOREIGN PATENT DOCUMENTS

| | | |
|---|---|---|
| EP | 0768573 A1 | 4/1997 |
| EP | 0785565 A1 | 7/1997 |
| EP | 0865067 A2 | 9/1998 |
| JP | 1-115027 | 5/1989 |
| JP | 1-124929 | 5/1989 |
| JP | 1-124930 | 5/1989 |
| JP | 2-155142 | 6/1990 |
| JP | 6-267421 | 9/1994 |
| JP | 6-273925 | 9/1994 |

* cited by examiner

*Primary Examiner*—Hoa Van Le
(74) *Attorney, Agent, or Firm*—Antonelli, Terry, Stout & Kraus, LLP

(57) ABSTRACT

Disclosed are a phosphor pattern which comprises a calcination product of a phosphor pattern precursor containing (A) an organic material containing at least one selected from the group consisting of an alkali metal and an alkaline earth metal; and (B) a phosphor wherein an amount of the alkali metal or the alkaline earth metal is 2% by weight or less based on the amount of (B) the phosphor, a process for preparing the same, an organic alkali developing solution for forming the same, an emulsion developing solution for forming the same and a back plate for plasma display using the same.

2 Claims, 3 Drawing Sheets

Fig. 1 (II)

Fig. 1 (III)

Fig. 1 (IV)

FLUORESCENT PATTERN, PROCESS FOR PREPARING THE SAME, ORGANIC ALKALI DEVELOPING SOLUTION FOR FORMING THE SAME, EMULSION DEVELOPING SOLUTION FOR FORMING THE SAME AND BACK PLATE FOR PLASMA DISPLAY USING THE SAME

CROSS-REFERENCE TO RELATED APPLICATIONS

This application is a divisional application under Rule 1.53(b) of application Ser. No. 09/059,351, filed on Apr. 14, 1998.

BACKGROUND OF THE INVENTION

This invention relates to a phosphor pattern, a process for preparing the same, an organic alkali developing solution for forming the same, an emulsion developing solution for forming the same and a back plate for plasma display using the same.

In the prior art, as one of flat plate displays, there has been known a plasma display panel (hereinafter referred to as "PDP") which enables multicolor display by providing a phosphor which emits light by plasma discharge.

In such PDP, flat front plate and back plate comprising glass are arranged in parallel with each other and facing to each other, both of the plates are retained at a certain interval by a cell barrier provided therebetween, and PDP has a structure that discharge is effected in a space surrounded with the front plate, the back plate and the cell barrier.

In such a cell, a phosphor is coated for display, and by discharge, the phosphor emits light by UV ray generated from filler gas, and the light can be recognized by an observer.

In the prior art, as a method for forming the phosphor, a method of coating a slurry liquid or a paste in which phosphors of the respective colors are dispersed is coated by a printing method such as screen printing has been proposed and disclosed in Japanese Provisional Patent Publications No. 115027/1989, No. 124929/1989, No. 124930/1989 and No. 155142/1990.

However, the above-mentioned phosphor-dispersed slurry liquid is a liquid state so that dispersion failure is likely caused by sedimentation of phosphors, etc. Also, when a liquid state photosensitive resist is used as the slurry liquid, there is a defect of markedly lowering in preservation stability with the progress of dark reaction. Moreover, the printing method such as screen printing is inferior in formation precision so that there are problems that it is difficult to cope with enlargement of a screen of PDP in the future, and others.

The method of using a liquid state photosensitive resist is a method in which respective components constituting a photosensitive resin composition containing phosphors are dissolved or mixed in a solvent which is capable of dissolving or dispersing the phosphors to prepare a liquid in which the phosphors are uniformly dissolved or dispersed in the solvent, and the liquid is directly coated to the above-mentioned substrate for PDP, and dried to form a phosphor pattern.

As a method for providing phosphors, there has been proposed a method of using a photosensitive element (it is also referred to as "a photosensitive film") containing phosphors (Japanese Provisional Patent Publications No. 267421/1994 and No. 273925/1994).

In the method of using a photosensitive film, a phosphor-containing photosensitive resin layer of a photosensitive film comprising a photosensitive resin layer containing a phosphor and a support film is embedded in the above PDP cell by contact bonding (lamination) under heating, the layer is subjected to imagewise exposure with active light such as UV ray by a photographic method using a negative film, an unexposed portion is removed by a developing solution such as an alkaline aqueous solution, and further unnecessary organic components are removed by calcination to form a phosphor only at a necessary portion.

When the above-mentioned photosensitive element is used, it is not necessary to confirm dispersibility of phosphors as conducted in a phosphor-dispersed slurry liquid or a phosphor-dispersed paste, and is excellent in preservation stability as compared with the phosphor-dispersed slurry liquid or the phosphor-dispersed paste. Moreover, since a photographic method is used, a phosphor pattern can be formed with good precision.

However, when a phosphor pattern is formed by directly coating a phosphor-containing liquid-state photosensitive resist to the above-mentioned substrate for PDP, or laminating on a substrate for the above-mentioned PDP a phosphor-containing photosensitive resin layer using a photosensitive element, then, imagewisely exposing with an active light such as an ultraviolet ray, etc., according to the photographic method, thereafter removing an unexposed portion by a developing solution such as an alkaline aqueous solution, and further a phosphor pattern is formed by removing the organic component by calcination, there sometimes causes problems of changes in emission characteristics (such as emission luminance and chroma) of phosphors.

SUMMARY OF THE INVENTION

An object of the present invention is to provide a phosphor pattern having less change in emission characteristics with good yield.

Another object of the present invention is to provide a process for preparing a phosphor pattern having less change in emission characteristics with good yield.

Further object of the present invention is to provide an organic alkali developer for forming a phosphor pattern which can prepare a phosphor pattern having less change in emission characteristics with good yield.

Still further object of the present invention is to provide an emulsion developer for forming a phosphor pattern which can prepare a phosphor pattern having less change in emission characteristics with good yield.

Moreover, an object of the present invention is t6 provide a back plate for a plasma display panel provided with a phosphor pattern having less change in emission characteristics.

The first invention relates to a phosphor pattern which comprises a calcination product of a phosphor pattern precursor containing (A) an organic material; and (B) a phosphor wherein an amount of the alkali metal or the alkaline earth metal contained in the phosphor pattern precursor is 2% by weight or less based on the amount of (B) phosphor.

The second invention relates to a process for preparing a phosphor pattern which comprises the steps of preparing a phosphor pattern precursor containing (A) an organic material and (B) a phosphor in which an amount of alkali metal or alkaline earth metal in the phosphor pattern precursor is 2% by weight or less based on the amount of (B) the phosphor, and calcining the precursor.

The third invention relates to a process for preparing a phosphor pattern as mentioned above, wherein the phosphor pattern precursor is formed by applying the photolithography method carrying out a wet development using (C) an alkali developer to a photosensitive resin composition containing a phosphor.

The fourth invention relates to a process for preparing a phosphor pattern as mentioned above, wherein the phosphor pattern precursor is formed by applying the photolithography method carrying out a wet development using an emulsion developer containing water and a solvent to a photosensitive resin composition containing a phosphor.

The fifth invention relates to a process for preparing a phosphor pattern as mentioned above, wherein the phosphor pattern precursor is formed by applying the photolithography method carrying out a wet development using an organic alkali developer to a photosensitive resin composition containing the phosphor.

The sixth invention relates to an organic alkali developer for forming a phosphor pattern containing an aliphatic amine, an aromatic amine or a tetraalkyl ammonium hydroxide.

The seventh invention relates to an emulsion developer for forming a phosphor pattern comprising an emulsion containing water and a solvent.

The eighth invention relates to a back plate for a plasma display panel provided with the above-mentioned phosphor pattern on the substrate for the plasma display pannel.

DESCRIPTION OF THE PREFERRED EMBODIMENTS

Figure 1:
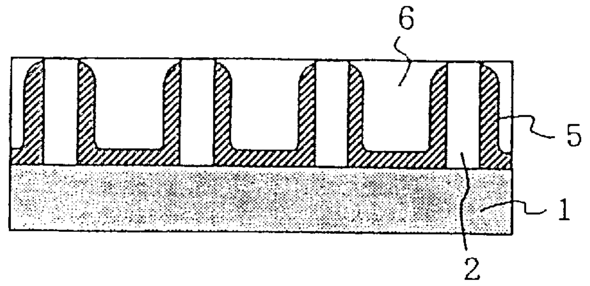
FIG. 1 is a schematical view showing respective steps for preparing a phosphor pattern.
Figure 1:
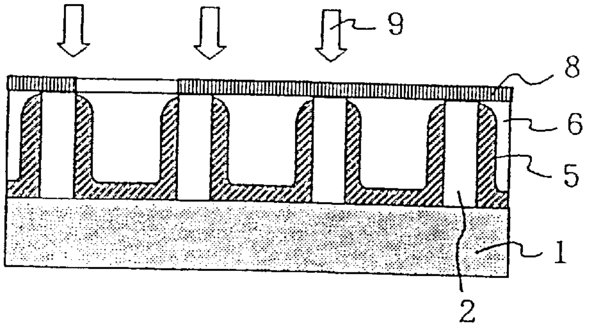
Figure 1:
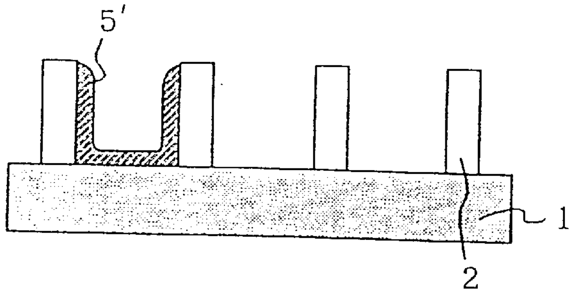
Figure 1:
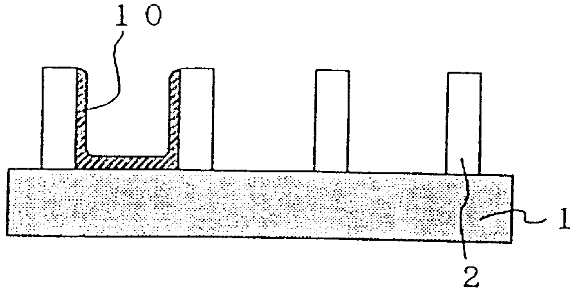

In the following, the present invention is explained in detail.

The phosphor pattern of the present invention can be prepared by calcining a phosphor pattern precursor which comprises (A) an organic material and (B) a phosphor in which an amount of alkali metal or alkaline earth metal in the phosphor pattern precursor is 2% by weight or less based on the amount of (B) the phosphor.

In the present invention, the phosphor pattern precursor can be prepared by coating a paste containing (A) an organic material such as an organic polymer binder, a compound (curing agent) having a functional group such as a vinyl group, a hydroxyl group, a carboxyl group, an epoxy group, an amino group, etc., a solvent, etc. and (B) a phosphor as essential components on a substrate for a plasma display panel by a screen printing method, a gravue coating method, etc., with a pattern state, and drying and curing under heating, if necessary.

For obtaining a pattern shape with high resolution, a phosphor pattern precursor can be formed by applying a photolithographic method to a photosensitive paste in which a phosphor is added to a photoresist.

Also, in view of forming a pattern with finer resolution, phosphor-formability to wall surface of a barrier rib and operatability, a phosphor pattern precursor can be formed by laminating a dry film (photosensitive element) having a photosensitive resin composition layer containing a phosphor on a substrate for a plasma display panel and applying a photolithographic method thereto.

As (A) the alkali metal or the alkaline earth metal in the present invention, examples thereof may include lithium, sodium, potassium, beryllium, magnesium, calcium, barium, rubidium, cesium, francium, strontium and radium, and they may exist in the form of a single material, or in the form of an organic acid salt or inorganic acid salt such as chloride, fluoride, bromide, iodide, hydroxide, sulfate, carbonate, bicarbonate, phosphate, pyrophosphate, saturated aliphatic acid salt, unsaturated aliphatic acid salt, aliphatic dibasic acid salt, aromatic dibasic acid salt, aliphatic tribasic acid salt, aromatic tribasic acid salt, etc.

Specific alkali metal salts or alkaline earth metal salts of the above-mentioned (A) may include, for example, sodium chloride, sodium bromide, sodium iodide, sodium hydroxide, sodium carbonate, sodium bicarbonate, sodium phosphate, sodium pyrophosphate, sodium acetate, sodium lactate, sodium fumarate, sodium benzoate, sodium terephthalate, sodium citrate, sodium sulfate, potassium chloride, potassium bromide, potassium iodide, potassium hydroxide, potassium carbonate, potassium bicarbonate, potassium phosphate, potassium pyrophosphate, potassium acetate, potassium glycolate, potassium fumarate, potassium benzoate, potassium terephthalate, potassium citrate, potassium sulfate, lithium chloride, lithium bromide, lithium hydroxide, lithium carbonate, lithium acetate, lithium lactate, lithium tartarate, lithium pyruvate, lithium sulfate, magnesium chloride hexahydrate, magnesium bromide hexahydrate, magnesium hydroxide, magnesium hydrogen carbonate, magnesium phosphate octahydrate, magnesium succinate, magnesium oleate, magnesium sulfate, calcium chloride, calcium bromide, calcium iodide hydrate, calcium hydroxide, calcium carbonate, calcium phosphate, calcium pyrophosphate, calcium acetate, calcium lactate pentahydrate, calcium citrate tetrahydrate, calcium formate, calcium gluconate, calcium salicylate dihydrate, calcium tartarate, calcium sulfate dihydrate, barium chloride, barium carbonate, barium acetate, barium hydrogen phosphate, barium hydroxide octahydrate, barium lactate, barium stearate, barium sulfate, sodium fluoride, potassium fluoride, lithium fluoride, magnesium fluoride, calcium fluoride, rubidium bromide, rubidium chloride, rubidium hydroxide, rubidium iodide, rubidium nitrate, rubidium sulfate, strontium acetate, strontium bromide hexahydrate, strontium carbonate, strontium chloride, strontium fluoride, strontium iodide, strontium sulfate, strontium oxalate, strontium hydroxide octahydrate, strontium di(methoxyethoxide), beryllium hydroxide, beryllium oxide, beryllium sulfate, etc. These can exist in a phosphor pattern precursor singly or in combination of two or more.

The phosphor (B) used in the present invention is not particularly limited and those mainly comprising metal oxide can be used.

As a phosphor which emits red light (red phosphor), there may be mentioned, for example, $Y_2O_2S$:Eu, $Zn_3(PO_4)_2$:Mn, $Y_2O_3$:Eu, $YVO_4$:Eu, (Y,Gd)$BO_3$:Eu, $\gamma Zn_3(PO_4)_2$:Mn, (Zn, Cd)S:Ag+$In_2$ $O_3$, etc.

As a phosphor which emits green light (green phosphor), there may be mentioned, for example, ZnS:Cu, $Zn_2SiO_4$:Mn, ZnS:Cu+$Zn_2SiO_4$:Mn, $Gd_2O_2S$:Tb, $Y_3Al_5O_{12}$:Ce, ZnS:Cu,Al, $Y_2O_2S$:Tb, ZnO:Zn, $Zn_2GeO_4$:Mn, ZnS:Cu,Al+$In_2O_3$, $LaPO_4$:Ce,Tb, BaO.6$Al_2O_3$:Mn, etc.

As a phosphor which emits blue light (blue phosphor), there may be mentioned, for example, ZnS:Ag, ZnS:Ag,Al, ZnS:Ag,Ga,Al, ZnS:Ag,Cu,Ga,Cl, ZnS:Ag+$In_2O_3$, $Ca_2B_5O_9Cl:Eu^{2+}$, $(Sr,Ca,Ba,Mg)_{10}(PO_4)_6Cl_2:Eu^{2+}$, $Sr_{10}(PO_4)_6Cl_2:Eu^{2+}$, $BaMgAl_{10}O_{17}:Eu^{2+}$ , $BaMgAl_{14}O_{23}:Eu^{2+}$, $BaMgAl_{16}O_{26}:Eu^{2+}$, etc.

In the present invention, the content of the alkali metal or the alkaline earth metal contained in the phosphor pattern precursor is made each 20 mg (2% by weight) or less based on 1 g of the phosphor (provided that the alkali metal or the alkaline earth metal constituting the phosphor is excluded from the above content). The terms "each 20 mg or less" mean that each one kind of the alkali metal and the alkaline earth metal is required to be 20 mg or less, or they do not mean that the total amount thereof is 20 mg or less. When two or more kinds of the above metals exist, the total content thereof is preferably 50 mg or less. When the content of the alkali metal or the alkaline earth metal exceeds 20 mg (2% by weight), emission characteristics (emission luminance and chroma) of phosphors after calcination of the phosphor pattern precursor change. Also, the content of the alkali metal or the alkaline earth metal is preferably 1% by weight or less, more preferably 0.1% by weight or less, particularly preferably 0.03% by weight or less in view of the point that an effect of inhibiting change in emission characteristics of the phosphor is remarkable. The content of the alkali metal or the alkaline earth metal can be measured by the atomic-absorption spectroscopy, etc.

In the present invention, a phosphor pattern can be obtained by calcining the phosphor pattern precursor. The phosphor pattern precursor means a pattern with a predetermined shape containing the organic material such as an organic polymer binder, etc. and the phosphor (B) before the step of calcination as essential components.

In the present invention, as a method of making the content of the alkali metal or the alkaline earth metal in the phosphor pattern precursor 2% by weight or less, when a phosphor pattern precursor is formed on the substrate by using a paste containing an organic material such as an organic polymer binder, etc. and a phosphor as essential components, the following methods can be used. For example, the method in which an organic material such as an organic polymer binder which contains no alkali metal nor alkaline earth metal and a phosphor (provided that the alkali metal or the alkaline earth metal constituting the phosphor is excluded) is used and a phosphor pattern precursor is formed by applying a printing method such as a screen printing, etc., or a coating method using a dispenser, etc.; the method in which the mixture of an organic material such as an organic polymer binder and a phosphor is applied to column chromatography, reprecipitation method, filtration, etc. to remove the alkali metal or the alkaline earth metal, then the above-mentioned patterning is carried out to form a phosphor pattern precursor; and the method in which the alkali metal or the alkaline earth metal is removed by subjecting the phosphor pattern precursor formed on the substrate to acid treatment; etc. may be mentioned.

When the phosphor pattern precursor is formed by applying the photolithographic method which effects wet development using various kinds of developers, there may be mentioned, for example, the method in which development is carried out by using an emulsion developer containing water and a solvent during the development step; the method in which development is carried out by using an organic alkali developer; the method in which development is carried out by using water as a developer; and the method in which after development is carried out by using an alkali developer (a developer containing the alkali metal or the alkaline earth metal such as sodium carbonate aqueous solution, etc.), the resulting material is subjected to acid treatment to remove the alkali metal or the alkaline earth metal; etc., may be mentioned.

As the acid to be used as the above-mentioned acid treatment, there may be mentioned, for example, an organic acid (a saturated aliphatic acid, an unsaturated aliphatic acid, an aliphatic dibasic acid, an aromatic dibasic acid, an aliphatic tribasic acid, an aromatic tribasic acid, an amino acid, an onium salt, etc.), an inorganic acid such as a Lewis acid, etc.

Specific examples of the organic acid may include, for example, formic acid, acetic acid, chloroacetic acid, dichloroacetic acid, trichloroacetic acid, propionic acid, capric acid, undecanoic acid, lauric acid, tridecanoic acid, myristic acid, pentadecanoic acid, palmitic acid, heptadecanoic acid, stearic acid, nonadecanoic acid, arachidic acid, palmitoleic acid, oleic acid, elaidic acid, linolenic acid, linoleic acid, oxalic acid, malonic acid, methylmalonic acid, ethylmalonic acid, monomethyl malonate, monoethyl malonate, succinic acid, methylsuccinic acid, adipic acid, methyladipic acid, pimelic acid, suberic acid, azelaic acid, sebacic acid, maleic acid, itaconic acid, phthalic acid, isophthalic acid, terephthalic acid, trimellitic acid, citric acid, salicylic acid, pyruvic acid, malic acid, aspartic acid, anisic acid, metanilic acid, sulfanilic acid, anthranilic acid, 2-aminoethylphos-phonic acid, 4-aminobutyric acid, benzoic acid, isonicotinic acid, methyl isonicotinate, 2-indol carboxylic acid, oxaloacetic acid, glyoxylic acid, glycolic acid, glycerin phosphoric acid, glucose-1-phosphoric acid, reduced type glutathione, glutamic acid, glutaric acid, chlorobenzoic acid; 2-chloropripionic acid, cinnamic acid, sarcosine, cyanobenzoic acid, cyanoacetic acid, 2,4-diaminobutyric acid, dichloroacetic acid, N,N-dimethylglycine, penicillamine, tartaric acid, thioglycolic acid, trichloroacetic acid, naphthoic acid, nitrobenzoic acid, lactic acid, barbituric acid, picric acid, picolinic acid, hydroxybenzoic acid, vinylacetic acid, 2,6-pyridinecarboxylic acid, phenylacetic acid, fumaric acid, 2-furancarboxylic acid, fluorobenzoic acid, fluoroacetic acid, bromobenzoic acid, hexafluoroacetylacetone, mandelic acid, mercaptobenzoic acid, iodobenzoic acid, iodoacetic acid, levulinic acid, glycine, alanine, valine, leucine, isoleucine, phenylalanine, asparagine, glutamine, tryptophane, proline, serine, threonine, thirosine, hydroxyproline, cysteine, cystine, methionine, aspartic acid, glutamic acid, lysine, arginine, histidine, ammonium acetate, ammonium adipate, ammonium arginate, ammonium amidesulfate, ammonium benzoate, ammonium bifluoride, ammonium bisulfate, ammonium bisulfite, ammonium hydrogen tartarate, ammonium bromide, ammonium chloride, diammonium citrate, triammonium citrate, ammonium diethyldithiocarbamate, ammonium dihydrogen phosphate, ammonium fluoride, ammonium borofluoride, ammonium formate, ammonium hexafluorophosphate, ammonium hydrogen fluoride, ammonium hydrogen tartarate, ammonium iodide, ammonium lactate, ammonium persulfate, diammonium phosphate, monoammonium phosphate, triammonium phosphate, ammonium phthalate, ammonium succinate, ammonium sulfite, ammonium thiocyanate, ammonium thiosulfate, dimethylamine hydrochloride, diethylamine hydrochloride, dibutylamine hydrochloride, trimethylamine hydrochloride, triethylamine hydrochloride, tributylamine hydrochloride, etc. Also, specific inorganic acid may include, for example, sulfuric acid, hydrochloric acid, nitric acid, phosphoric acid, etc.

Also, as the acid for the acid treatment, the quaternary ammonium salt having a cationic property on the nitrogen atom represented by the following formula (III) which is a Lewis acid:

(III)

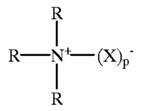

wherein R represents an alkyl group having 1 to 10 carbon atoms, a benzyl group, a phenyl group or an alkyleneoxy group having 1 to 4 carbon atoms, a plural number of R's may be the same or different from each other; X represents a group in which one hydrogen atom is removed from either of the above-mentioned saturated aliphatic acids, a group in which one hydrogen atom is removed from either of the above-mentioned unsaturated aliphatic acids, a group in which one hydrogen atom is removed from either of the above-mentioned inorganic acids, a halogen atom or a halogenated compound, and p is an integer of 1 to 3, or the quaternary phosphonium salt having a cationic property on the phosphorus atom represented by the following formula (IV):

(IV)

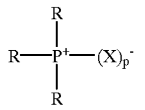

wherein R, X and p have the same meanings as defined in the formula (III), can be used.

Specific examples of such quaternary ammonium salts or quaternary phosphonium salts may include, for example, tetrabutylammonium fluoride, tetrabutylammonium borofluoride, tetramethylammonium chloride, tetraethylammonium chloride, tetrabutylammonium chloride, tetrapentylammonium chloride, tetraoctylammonium chloride, benzyltriethylammonium chloride, benzyltributylammonium chloride, tetraethylammonium perchlorate, tetrabutylammonium perchlorate, tetramethylammonium bromide, tetraethylammonium bromide, tetrabutylammonium bromide, tetrabutylammonium tribromide, benzyltrimethylammonium tribromide, tetramethylammonium iodide, tetraethylammonium iodide, tetrabutylammonium iodide, benzyltrimethylammonium iodide, tetraethylammonium acetate, tetrabutylammonium acetate, tetraethylammonium formate, tetrabutylammonium formate, tetramethylammonium formate, tetrabutylammonium dihydrogen phosphate, tetrabutylammonium hydrogen borocyanide, tetrabutylammonium borohydride, tetrabutylammonium hydrogen sulfate, tetrabutylammonium nitrate, tetrabutylammonium phosphate, tetrabutylammonium tetrafluoroborate, benzyltrimethylammonium dibromohydrochloride, trimethylammonium hexafluorophosphate, benzyltrimethylammonium tetrachlorohydroiodide, tetramethylammonium tetrafluoroborate, tetraethylammonium tetrafluoroborate, tetrabutylphosphonium chloride, benzyltriphenylphosphonium chloride, tetrabutylphosphonium bromide, etc. These materials may be used singly or in combination of two or more.

Among these, tetramethylammonium chloride, tetraethylammonium chloride, tetrabutylammonium chloride, tetramethylammonium bromide, tetraethylammonium bromide, tetrabutylammonium bromide, tetraethylammonium acetate, tetrabutylammonium acetate, tetraethylammonium formate, tetrabutylammonium formate, tetramethylammonium formate, tetramethylammonium acetate, benzyltriethylammonium chloride and benzyltributylammonium chloride are preferred in view of the points that damage by the acid treatment to the surface of the dielectric layer constituted from a metal such as Mg, Si, Ca, Al, Zn, Pb, etc. and oxides thereof formed on the substrate for PDP can be made small, and roughening, crack, etc. can be inhibited.

The acid treatment can be carried out by using a solution (an acid solution) (the concentration of the acid-is preferably 0.01 to 50% by weight, more preferably 1 to 10% by weight or so) in which the above-mentioned acid is dissolved in a solvent(water and/or a solvent), at a solution temperature of 10 to 80° C. or so for 1 to 180 minutes or so applying thereto the known methods such as spraying, dipping by rocking, brushing, scrapping, etc. A pH of the acid solution to be used in the acid treatment is preferably made 2 to 7. The pH and the temperature of the acid aqueous solution, and the treatment time can be adjusted depending on the phosphor pattern precursor and the acid resistance of the substrate for the PDP (durability against the acid, which does not deteriorate by the acid).

Further, after the acid treatment, a step of washing with water may be performed.

The solvent to be used in the acid solution is not particularly limited but the following can be exemplified.

Examples may include a glycol type solvent such as 1,2-diethoxyethane, 1,2-dibutoxyethane, diethylene glycol dimethyl ether, diethylene glycol diethyl ether, diethylene glycol dibutyl ether, 2-(isopentyloxy)ethanol, 2-(isohexyloxy)ethanol, 2-phenoxyethanol, 2-(benzyloxy)ethanol, diethylene glycol monobutyl acetate, etc.; an aromatic type solvent such as toluene, xylene, ethylbenzene, cumene, mesitylene, butylbenzene, p-cymene, diethylbenzene, pentylbenzene, dipentylbenzene, tetraline, pyridine, a-picoline, β-picoline, γ-picoline, 2,4-lutidine, 2,6-lutidine, quinoline, etc.; an ester type solvent such as ethyl formate, propyl formate, butyl formate, isopropyl formate, pentyl formate, methyl acetate, ethyl acetate, propyl acetate, isopropyl acetate, butyl acetate, isobutyl acetate, sec-butyl acetate, pentyl acetate, isopentyl acetate, sec-hexyl acetate, methyl propionate, ethyl propionate, butyl propionate, isopentyl propionate, methyl butyrate, ethyl butyrate, butyl butyrate, isopentyl butyrate, butyl isobutyrate, ethyl 2-hydroxy-2-methyl-propionate, methyl isovalerinate, isopentyl isovalerinate, methyl benzoate, ethyl benzoate, propyl benzoate, butyl benzoate, isopentyl benzoate, 2-ethylbutyl acetate, 2-ethylhexyl acetate, cyclohexyl acetate, benzyl acetate, 3-methoxybutyl acetate, 3-methyl-3-methoxymethoxybutyl acetate, γ-butyrolactone, ethylene glycol monolauric acid ester, ethylene glycol monomyristic acid ester, ethylene glycol monopalmitic acid ester, ethylene glycol monomargaric acid ester, ethylene glycol monostearic acid ester, glycerine triacetate, glycerine monobutyrate, diethyl carbonate, butyl lactate, pentyl lactate, 2-ethoxyethyl acetate, 2-butoxyethyl acetate, methyl acetoacetate, ethyl acetoacetate, etc.; a ketone type solvent such as cyclopentanone, cyclohexanone, methylcyclohexanone, acetophenone, camphor, 2-pentanone, 3-pentanone, 2-hexanone, methyl isobutyl ketone, 2-pentanone, 4-heptanone diisobutyl ketone, acetonylacetone, etc.; an alcohol type solvent such as 1-butanol, 2-butanol, isobutyl alcohol, 1-pentanol, 2-pentanol, 3-pentanol, 2-methyl-1-butanol, isopentyl alcohol, tert-pentyl alcohol, 3-methyl-2-butanol, neopentyl alcohol, 1-hexanol, 2-methyl-1-pentanol, 4-methyl-2-pentanol, 2-ethyl-1-butanol, 1-heptanol, 2-heptanol, 3-heptanol, 1-octanol, 2-octanol, 2-ethyl-1-hexanol, 1-nonanol, 3,5,5-trimethyl-1-hexanol, 1-decanol, 1-undecanol, 1-dodecanol, benzylalcohol, cyclohexanol, 1-methylcyclohexanol, 2-methylcyclohexanol, 3-methylcyclo-hexanol, 4-methylcyclohexanol, 1,2-butanediol, 2-ethyl-1, 3-hexanediol, etc.; an ether type solvent such as diethyl ether, dipropyl ether, diisopropyl ether, dibutyl ether, dihexyl ether, anisol, phenetol, butylphenyl ether, pentylphenyl ether, methoxytoluene, benzylethyl ether, diphenyl ether, dibenzyl ether, veratrol, propylene oxide, dioxane, trioxane, tetrahydrofuran, tetrahydropyran, cineole, etc.

These solvents may be used singly or in combination of two or more.

In the present invention, when a pattern is formed by using an alkali developer (a developer containing an alkali metal or an alkaline earth metal) to effect wet development by the photolithography method, the alkali metal or the alkaline earth metal remains in the pattern after development so that the acid treatment is effectively carried out to remove these metals.

As the above alkali developer, there may be mentioned a solution in which an alkali hydroxide (hydroxide of lithium, sodium or potassium, etc.), an alkali carbonate (carbonate or bicarbonate of lithium, sodium or potassium, etc.), an alkali metal phosphate (potassium phosphate, sodium phosphate, etc.), an alkali metal pyrophosphate (sodium pyrophosphate, potassium pyrophosphate, etc.), etc. is/are dissolved in a solvent, and of these, preferred is a solution in which sodium carbonate, potassium carbonate, etc. is/are dissolved in a solvent (water and/or a solvent). The solvent is preferably water in the points that it is harmless to environment and the waste solution can be easily treated.

A pH of the alkali developer to be used in the development is preferably 9 to 11, and the temperature of the same can be adjusted depending on developability of a photosensitive resin composition containing a phosphor.

Also, to the alkali developer, a surfactant, a deforming agent, and a small amount of a solvent which accelerates the development may be added.

Components for constituting the photosensitive resin composition containing a phosphor of the present invention are not particularly limited and can be constituted by a photosensitive resin composition generally used for the photolithographic method. In the points of photosensitivity and workability, those containing (a) a film-forming property-providing polymer, (b) a photopolymerizable unsaturated compound having an ethylenic unsaturated group, (c) a photopolymerization initiator and (d) a phosphor as described in Japanese Provisional Patent Publication No. 265906/1997 are preferred.

In order to realize development of the photosensitive resin composition containing a phosphor of the present invention by various kinds of developers, a content of a carboxyl group (which can be regulated by an acid value (mg KOH/g)) of the film-forming property-providing polymer can be optionally controlled.

For example, when development is carried out by using an organic alkali developer, the acid value is preferably made 90 to 260. If the acid value is less than 90, development is tend to be difficult, while if it exceeds 260, developer resistance (a property in which a portion which becomes a remaining pattern without removing by the development is not removed by the developer) is tend to be lowered.

When development is carried out by using an alkali developer or by using water, the acid value is preferably made 16 to 260. If the acid value is less than 16, development is tend to be difficult, while if it exceeds 260, developer resistance is tend to be lowered.

When development is carried out by using an emulsion developer comprising water and a solvent (preferably one or more solvents which do not dissolve in water), the film-forming property-providing polymer may not have a carboxyl group.

As the above-mentioned phosphor (d), the above-mentioned phosphor (B) may be mentioned.

A formulation amount of the above-mentioned component (a) is preferably 10 to 90 parts by weight, more preferably 20 to 80 parts by weight based on the total weight of the component (a) and the component (b) being made 100 parts by weight. If the amount is less than 10 parts by weight, when it is supplied in a roll state as a photosensitive element, the photosensitive resin composition containing a phosphor is oozed out from the edge portion of the roll (hereinafter referred to this phenomenon as "edge fusion") so that the roll can hardly be dispatched when laminating the photosensitive element, and the oozed out portion is partially excessively buried in the space of the substrate for PDP whereby causing the problem that a production yield is remarkably lowered, etc. or there is a tendency of lowering in film-forming property. If it exceeds 90 parts by weight, sensitivity is tend to be insufficient.

A formulation amount of the above-mentioned component (b) is preferably 10 to 90 parts by weight, more preferably 20 to 80 parts by weight based on the total weight of the component (a) and the component (b) being made 100 parts by weight. If the amount is less than 10 parts by weight, sensitivity of the photosensitive resin composition containing a phosphor tend to be insufficient, while if it exceeds 90 parts by weight, the photocured product is tend to be brittle, and when a photosensitive element is made, the photosensitive resin composition containing a phosphor is oozed out from the edge portion due to its fluidity or a film-forming property is tend to be lowered.

A formulation amount of the above-mentioned component (c) is preferably 0.01 to 30 parts by weight, more preferably 0.1 to 20 parts by weight based on the total weight of the component (a) and the component (b) being made 100 parts by weight. If the amount is less than 0.01 part by weight, sensitivity of the photosensitive resin composition containing a phosphor tend to be insufficient, while if it exceeds 30 parts by weight, absorption of an active light at the exposed surface of the photosensitive resin composition containing a phosphor is increased whereby photocuring at the inner portion is tend to be insufficient.

A formulation amount of the above-mentioned component (d) is preferably 10 to 500 parts by weight, more preferably 10 to 400 parts by weight, particularly preferably 10 to 300 parts by weight, most preferably 50 to 250 parts by weight based on the total weight of the component (a), the component (b) and the component (c) being made 100 parts by weight. If the amount is less than 10 parts by weight, when it is emitted as a PDP, an emission efficiency is tend to be lowered, while if it exceeds 500 parts by weight, when it is made as a photosensitive element, a film-forming property or flexibility is tend to be lowered.

In the present invention, in the photolithographic method, when wet development is carried out to form a phosphor pattern precursor, a method of subjecting to wet development using an organic alkali developer is effective.

As the above-mentioned organic alkali developer, there may be mentioned a solution in which an organic alkali is dissolved in water, a solution in which an organic alkali is dissolved in a solvent or a solution in which an organic alkali is dissolved in a mixture of water and a solvent. As the organic alkali, there may be mentioned an aliphatic amine, an aromatic amine, tetraalkyl ammonium hydroxide, etc.

As the above-mentioned aliphatic amine, examples may include, for example, methylamine, ethylamine, propylamine, isopropylamine, butylamine, isobutylamine, sec-butylamine, tert-butylamine, 1,4-butanediamine, cyclohexylamine, 1,6-hexanediamine, hexylamine, benzylamine, phenylethylamine, 2-amino-2-hydroxymethyl-1,3-propanediol, 1,3-diaminopropanol-2-morpholine, dimethylamine, diethylamine, dipropylamine, N-methylamine, trimethylamine, triethyl-amine, tripropylamine, N,N-dimethylamine, N,N-dimethylethyleneamine, ethanolamine, diethanolamine, triethanolamine, tris(hydroxymethyl)methylamine, dimethylamine, ethylenediamine, diethylenetriamine, etc.

As the above-mentioned aromaticamine, there may be mentioned aniline, dimethylaniline, toluidine, phenylenediamine, anisidine, etc.

Specific tetraalkylammonium hydroxide may include tetramethylammonium hydroxide, tetraethylammonium hydroxide, tetrabutylammonium hydroxide, benzyltrimethylammonium hydroxide, benzyltriethylammonium hydroxide, benzyltributylammonium hydroxide, etc.

These organic amines may be used singly or in combination of two or more.

Among these, tetramethylammonium hydroxide, tetraethylammonium hydroxide, tetrabutylammonium hydroxide, etc. are preferably used.

In addition to the above-mentioned developers, a solution in which ammonium hydroxide is dissolved in water, a solution in which ammonium hydroxide is dissolved in a solvent, or a solution in which ammonium hydroxide is dissolved in a mixed solution of water and a solvent may by used.

A pH of the organic alkali developer to be used in the development is preferably made 9 to 11. The content of the organic alkali is preferably 0.01 to 15% by weight based on the total weight of the organic developer in view of developability. Also, the temperature of the same can be adjusted depending on developability of a photosensitive resin composition containing a phosphor.

Also, to the organic alkali developer, a surfactant, a deforming agent, and a small amount of a solvent which accelerates the development may be added.

As the above-mentioned solvent, there may be mentioned, for example, acetone alcohol, acetone, ethyl acetate, an alkoxy ethanol having an alkoxy group with 1 to 4 carbon atoms, ethyl alcohol, isopropyl alcohol, butyl alcohol, diethylene glycol monomethyl ether, diethylene glycol monoethyl ether, diethylene glycol monobutyl ether, triethylene glycol monobutyl ether, dipropylene glycol monomethyl ether, dipropylene glycol monopropyl ether, 3-methyl-3-methoxybutylacetate, 1,1,1-trichloroethane, N-methyl-2-pyrrolidone, N,N-dimethylformamide, cyclohexanone, methyl isobutyl ketone, γ-butyrolactone, etc. These solvents may be used singly or in combination of two or more.

In the present invention, in view of workability, an emulsion developer containing water and a solvent may be used in place of the above-mentioned organic alkali developer.

The emulsion developer is preferably mixed with at least one kind of a surfactant (hereinafter referred to "surfactants") depending on necessity and further at least one kind of a polymerization inhibitor depending on necessity.

The mixing ratio of the respective components is preferably (1) 1 to 99% by weight of water, (2) 1 to 99% by weight of a solvent and (3) 0 to 30% by weight of a surfactant, more preferably (1) 10 to 80% by weight of water, (2) 20 to 90% by weight of a solvent and (3) 0 to 30% by weight of a surfactant, particularly preferably (1) 10 to 70% by weight of water, (2) 30 to 85% by weight of a solvent and (3) 0 to 20% by weight of a surfactant. If the mixing ratio of water is less than 1% by weight or the mixing ratio of the solvent exceeds 99% by weight, inflammability, toxicity and swellability tend to be increased. If the mixing ratio of water exceeds 99% by weight or the mixing ratio of the solvent is less than 1% by weight, lipophilic property and developability are tend to be impaired. When the mixing ratio of the surfactant exceeds 30% by weight, emulsion cannot be formed and the liquid tends to become a uniform solution.

Particularly preferred solvent to be used in the emulsion developer may include the above-mentioned glycol type solvent, aromatic type solvent, ester type solvent, ketone type solvent, alcohol type solvent and ether type solvent.

As the solvent to be used in the emulsion developer, those having 4 to 30 carbon atoms and a boiling point of 60 to 350° C. are preferred and those having 4 to 20 carbon atoms and a boiling point of 60 to 280° C. are more preferred. Any solvents in which the carbon number or the boiling point is out of the above range involve the problem that developability tends to be lowered.

In view of developability, solubility of water in a solvent (at the temperature of the developer when development is carried out) is preferably 30% by weight or less and/or solubility of a solvent in water at the temperature when it is used is preferably 30% by weight or less.

The above-mentioned surfactant preferably has a total carbon number of a hydrophobic organic group(s) is 8 to 50, more preferably 12 to 25. In the total carbon number of the hydrophobic organic group, carbons of an organic group having hydrophilic property such as a polyoxyethylene group are not included.

As the above-mentioned surfactant, there may be specifically mentioned (1) anionic surfactants such as salts of alkylbenzenesulfonic acid derivatives, alkylnaphthalenesulfonic acid derivatives or alkylsulfosuccinic acid derivatives each having hydrophobic alkyl chain with the total carbon number of 8 to 30, or a mixture thereof; (2) cationic surfactants such as quaternary ammonium salts having the total carbon number of 8 to 50, or a mixture thereof; and (3) nonionic surfactants such as polyoxyethylene aliphatic acid esters, polyoxyethylenesorbitane aliphatic acid ester, polyoxyethylene alkyl ether, polyoxyethylene alkyl aryl ether or a mixture thereof. Among these surfactants, at least one selected from the above surfactants and having an HLB (hydrophilic-lipophilic balance) value within the range of 2.8 to 50 is preferably used.

The anionic surfactants preferably have a hydrophobic alkyl chain with the total carbon number within the range of 10 to 20, more preferably 12 to 20. Also, as a pair ion, a quaternary ammonium is preferred.

As the quaternary ammonium salt suitably used as the cationic surfactants, among the range of the total carbon number as mentioned above, those having 9 to 25 are particularly excellent. As a pair anion, a sulfonic acid ion, an organic sulfonic acid ion, a halogen ion, a phosphoric acid ion, an organic phosphoric acid ion, etc. are suitable. As the nonionic surfactants, those having a polyoxyethylene group are preferred and those in which a polymerization degree of the polyoxyethylene is in the range of 2 to 100 are more preferred. In the above-mentioned total number of carbon atoms of the hydrophobic alkyl chain in the above-mentioned anionic surfactant, the carbon atoms which constitute an aromatic nucleus are not contained, and the HLB value is calculated from the Davis method.

As the above-mentioned polymerization inhibitor, specific examples may include hydroquinone, hydroquinone monomethyl ether, benzoquinone, pyrogallol, chatechol, chatechol amine, derivatives thereof, etc., and they may be used singly or in combination of two or more.

In the following, one example of a process for preparing the phosphor pattern of the present invention is explained by referring to FIG. 1. FIG. 1 is a schematic view showing respective steps of one example of a process for preparing the phosphor pattern of the present invention, and the reference numeral 1 is a substrate, 2 is a barrier rib, 5 is a photosensitive resin composition, 5' is a photosensitive resin composition after photocuring, 6 is an embedding layer, 8 is a photomask, 9 is an active light and 10 is a phosphor pattern.

The phosphor pattern of the present invention can be prepared by performing at least (I) a step of forming a photosensitive resin composition layer containing a phosphor on a substrate having an unevenness, (II) a step of imagewisely irradiating an active light to the photosensitive resin composition layer containing a phosphor, (III) a step of selectively removing by development the photosensitive resin composition layer containing a phosphor subjected to imagewisely irradiated by an active light by development to form a pattern, and (IV) a step of forming a phosphor pattern by removing unnecessary portion from the above-mentioned phosphor pattern precursor by calcination.

(I) Step of forming photosensitive resin composition layer containing phosphor on a substrate having unevenness The photosensitive resin composition layer containing a phosphor is formed on the uneven surface of a substrate having unevenness by using a liquid state or photosensitive element. As a method for forming the layer, it is not particularly limited, and there may be mentioned, for example, the method in which a liquid state paste obtained by uniformly dissolving or dispersing respective components constituting the photosensitive resin composition layer containing a phosphor as mentioned above in a solvent which can dissolve or disperse the components is directly coated on the uneven surface and dried; the method in which the photosensitive resin composition layer is formed on the uneven surface by using a photosensitive element having the photosensitive resin composition layer containing a phosphor as mentioned above; etc.

As the substrate having unevenness in the present invention, a substrate for a plasma display panel (a substrate for PDP) to which barrier ribs are formed, etc. may be mentioned.

Figure 2:
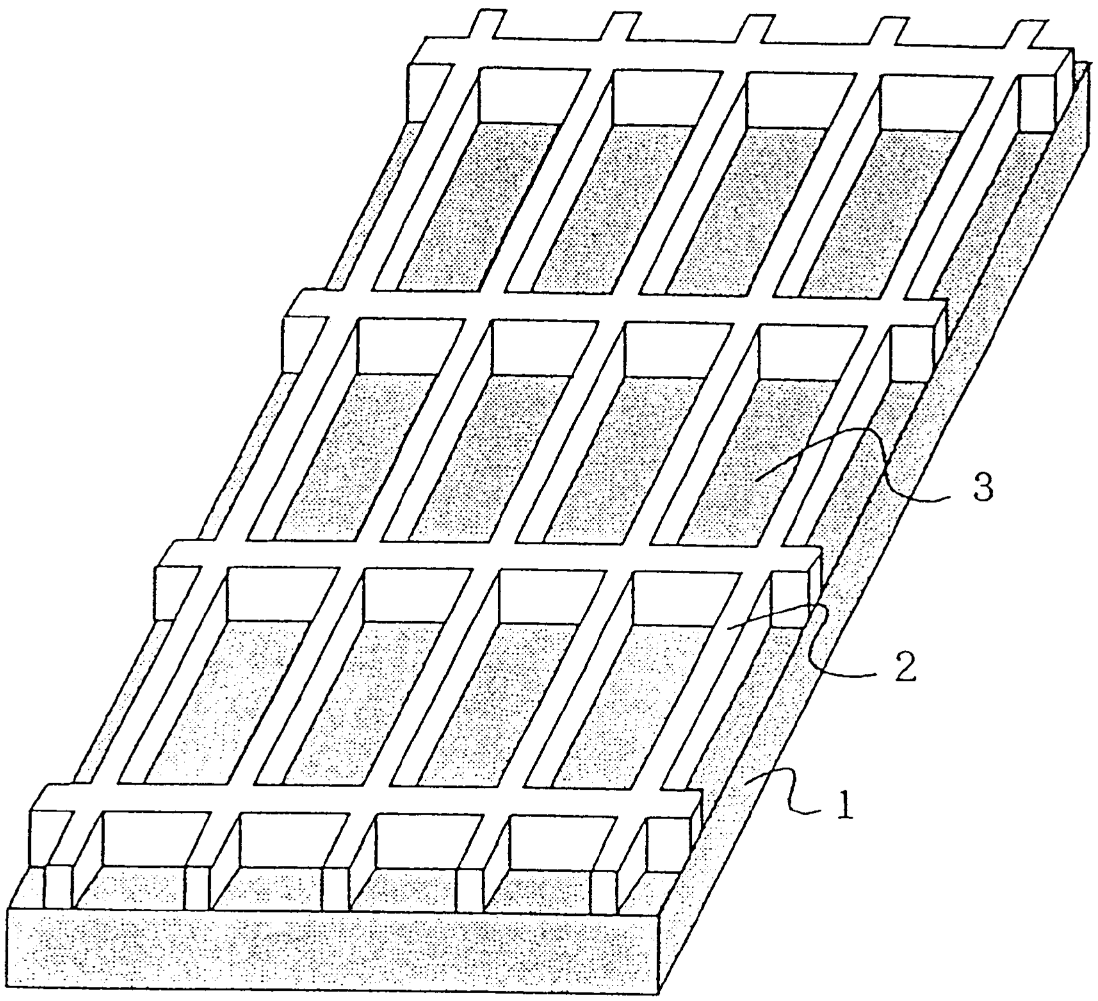
FIG. 2 is a schematical view showing one example of a substrate for PDP to which a barrier rib is formed.
Figure 3:
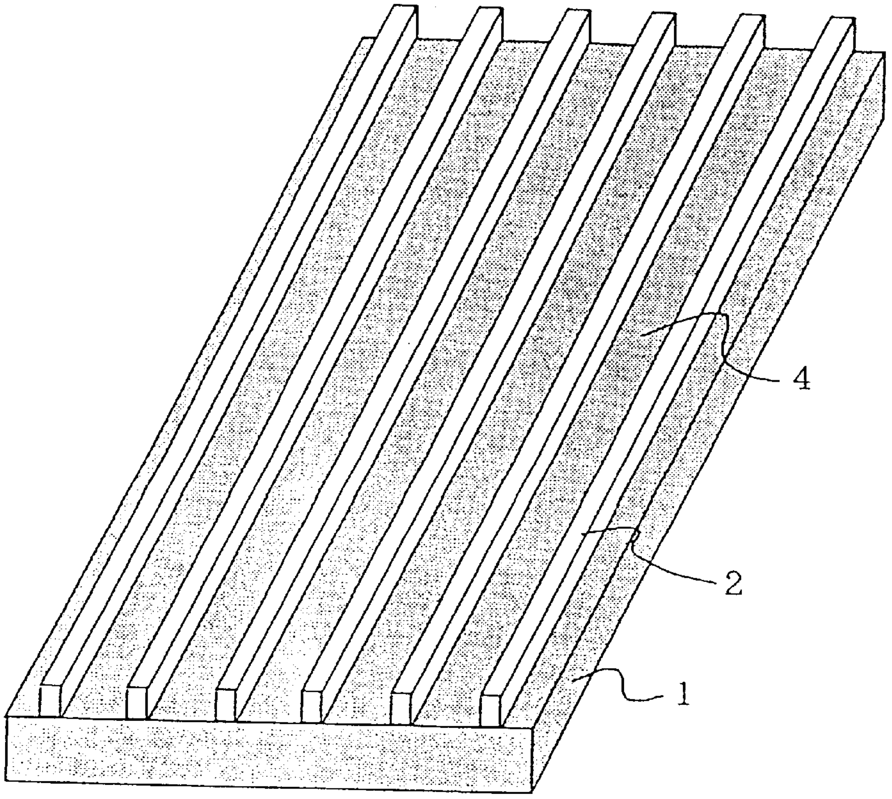
FIG. 3 is also a schematical view showing one example of a substrate for PDP to which a barrier rib is formed.

In FIG. 2 and FIG. 3, one example of the schematic view of a substrate for PDP in which barrier ribs are formed is shown, respectively. The barrier rib generally has a height of 20 to 500 μm and a width of 20 to 200 μm. In FIG. 2 and FIG. 3, 3 is a lattice-shaped discharge space, and 4 is a striped discharge space. The shape of a discharge space surrounded with the barrier ribs is not particularly limited and may be lattice-shaped, striped, honeycomb-shaped, triangular or elliptical. In general, a lattice-shaped or striped discharge space as shown in FIG. 2 or FIG. 3 is formed.

In FIG. 2 and FIG. 3, on a substrate 1, barrier ribs 2 are formed, and in FIG. 2, a lattice-shaped discharge space 3 is formed and in FIG. 3, a striped discharge space 4 is formed. The size of the discharge space is determined by the size and resolution of PDP. In general, in the lattice-shaped discharge space as shown in FIG. 2, the longitudinal and lateral lengths are 50 μm to 1 mm, and in the striped discharge space as shown in FIG. 3, the interval is 30 μm to 1 mm.

(II) Step of irradiating active light imagewisely to photosensitive resin composition layer containing phosphor The state of irradiating an active light 9 imagewisely is shown in FIG. 1 (II). In FIG. 1 (II), as a method for imagewisely irradiating the active light 9, there may be mentioned a method in which the active light 9 is imagewisely irradiated through a photomask 8 such as a negative film, a positive film, etc. placed on or above the photosensitive resin composition 5 containing a phosphor in the state as shown in FIG. 1 (I).

As the active light, there may be preferably used light generated from a known active light source, for example, a light generated from carbon arc, mercury vapor arc, xenon arc and others.

(III) Step of forming pattern by selectively removing photosensitive resin composition layer containing phosphor to which active light is imagewisely irradiated by development The state in which an unnecessary portion is removed by development is shown in FIG. 1 (III). In FIG. 1 (III), 5' is a photosensitive resin composition containing a phosphor after photocuring.

In FIG. 1 (III), as the development method, there may be mentioned, for example, a method in which, after the state shown in FIG. 1 (II), when a support film exist on or above the photosensitive resin composition 5 containing a phosphor, the support film is removed and then development is carried out by using a developer by the conventionally known method such as spraying, dipping by rocking, blushing, scrapping, etc. to remove the unnecessary portion.

When an alkali developer is used as the developing solution, the resulting pattern is subjected to an acid treatment after development. When an organic alkali developer or an emulsion developer is used as a developer, it is not particularly required to effect the acid treatment to the resulting pattern.

(IV) Step of forming phosphor pattern by removing unnecessary portion from the above-mentioned phosphor pattern precursor by calcination The state in which a phosphor pattern is formed, which is after removing an unnecessary portion by calcination, is shown in FIG. 1 (IV). In FIG. (IV), the reference numeral 10 is a phosphor pattern.

In FIG. 1 (IV), the calcination method is not particularly limited, and a phosphor pattern can be formed by removing an unnecessary portion other than the phosphor and binder by applying the conventionally known method.

At the time of calcination, the maximum calcination temperature is preferably 350 to 800° C., more preferably 400 to 600° C. The calcination maintaining time at the calcination temperature is preferably 3 to 120 minutes, more preferably 5 to 90 minutes. The temperature raising rate at this time is preferably 0.5 to 50° C./min, more preferably 1 to 45° C./min. Also, during the temperature range of 350 to 450° C. which is before reaching to the maximum calcination temperature, a step of retaining the temperature may be provided, and the retaining time is preferably 5 to 100 minutes.

The back plate for the plasma display panel of the present invention comprises the phosphor pattern obtained as mentioned above on the substrate for the plasma display panel.

Figure 4:
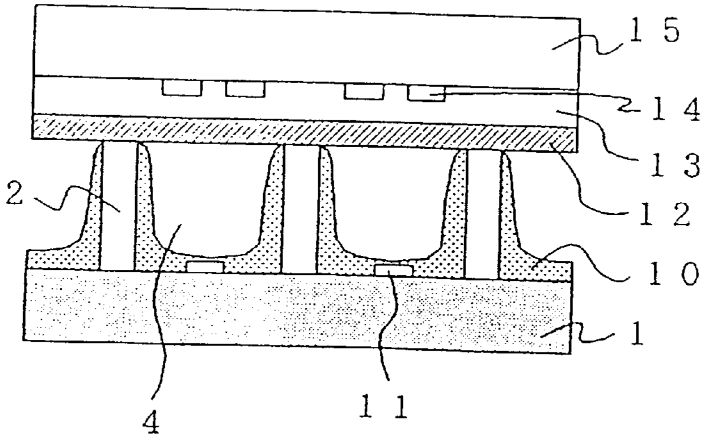
FIG. 4 is a schematic view showing one example of a plasma display panel of the present invention.

In the following, a back plate for a plasma display panel is explained by referring to FIG. 4. FIG. 4 is a schematic drawing showing one example of a plasma display panel (PDP), and in FIG. 4, the reference numeral 1 is a substrate, 2 is a barrier rib, 4 is a striped discharge space, 10 is a phosphor pattern, 11 is an electrode for address, 12 is a protective film, 13 is a dielectric layer, 14 is an electrode for display, and 15 is a substrate for a front plate.

In FIG. 4, the bottom portion including the substrate 1, barrier ribs 2, phosphor pattern 10 and electrode for address 11 is a back plate for PDP, and the upper portion including the protective film 12, dielectric layer 13, electrode for display 14 and substrate for the front plate is a front plate for PDP.

PDP can be classified into AC (alternating current) type PDP, DC (direct current) type PDP, etc. in the point of voltage applying system, and the schematic drawing of FIG. 4 shown as one example is an AC type PDP.

The process for producing the phosphor pattern and the photosensitive element of the present invention can be applied to a self-emission type display such as a field emission display (FED), an electroluminescense display (ELD), etc.

EXAMPLES

In the following, the present invention is explained by referring to Examples.

Preparation Example 1

(Preparation of Solution (d-1) of film property providing polymer)

In a flask provided with a stirrer, a reflux condenser, an inactive gas inlet tube and a thermometer was charged a mixed solvent ① shown in Table 1, and the temperature of the solvent was raised to 80° C. under nitrogen atmosphere, and while maintaining the reaction temperature at 80° C.±2° C., a mixed solution ② of a material shown in Table 1 was uniformly added dropwise. After dropwise addition, stirring was continued at 80° C.±2° C. for 6 hours to obtain Solution (d-1) (solid content: 45.5% by weight) of a film property providing polymer having a weight average molecular weight of 80,000 and an acid value of 130 mgKOH/g.

TABLE 1

| | Material | Formulation amount |
|---|---|---|
| ① | Ethylene glycol monomethyl ether | 70 parts by weight |
| | Toluene | 50 parts by weight |
| ② | Methacrylic acid | 20 parts by weight |
| | Methyl methacrylate | 55 parts by weight |
| | Ethyl acrylate | 15 parts by weight |
| | n-Butyl methacrylate | 10 parts by weight |
| | 2,2'-Azobis(isobutyronitrile) | 0.5 parts by weight |

Preparation Example 2

(Preparation of Solution (D-1) for photosensitive resin composition layer containing phosphor)

The materials shown in Table 2 were mixed for 15 minutes by using a stirrer to prepare Solution (D-1) for a photosensitive resin composition layer containing a phosphor.

TABLE 2

| Material | Formulated amount |
|---|---|
| Solution (d-1) of film property providing polymer obtained in Preparation example 1 | 132 parts by weight (solid content: 60 parts by weight) |
| Polypropylene glycol dimethacrylate (average number of propylene oxide: 12) | 40 parts by weight |
| 2-Benzyl-2-dimethylamino-1-(4-morpholino-phenyl)-butanone-1 | 1 parts by weight |
| $BaMgAl_{14}O_{23}$: $Eu^{2+}$ (Blue phosphor) | 110 parts by weight |
| Methyl ethyl ketone | 30 parts by weight |

Solution (D-1) for a photosensitive resin composition layer containing a phosphor obtained in Preparation example 2 was uniformly coated on the surface of a polyethylene-terephthalate film with a thickness of 20 μm, and dried with a hot air convection type drier at 110° C. for 10 minutes to remove the solvent whereby a photosensitive resin material containing phosphor was formed. The thickness of the resulting photosensitive resin material containing phosphors was 50 μm.

Then, on the photosensitive resin material containing phosphors, a polyethylene film with a thickness of 25 μm was further laminated as a cover film to prepare a photosensitive element (i).

Preparation Example 3

(Preparation of Solution (D-2) for photosensitive resin composition containing phosphor)

In Preparation example 2, the same procedure was repeated except for changing the materials shown in Table 2 with those shown in Table 3, to prepare Solution (D-2) for a photosensitive resin composition containing a phosphor.

TABLE 3

| Material | Formulated amount |
|---|---|
| Solution (d-1) of film property providing polymer obtained in Preparation example 1 | 132 parts by weight (solid content: 60 parts by weight) |
| Polypropylene glycol dimethacrylate (average number of propylene oxide: 12) | 40 parts by weight |
| 2-Benzyl-2-dimethylamino-1-(4-morpholino-phenyl)-butanone-1 | 2 parts by weight |
| $Zn_2SiO_4$: Mn (Green phosphor) | 120 parts by weight |
| Malonic acid | 0.3 part by weight |
| Methyl ethyl ketone | 30 parts by weight |

Solution (D-2) for a photosensitive resin composition layer 15 containing a phosphor obtained in Preparation example 3 was uniformly coated on the surface of a polyethylene-terephthalate film with a thickness of 20 μm, and dried with a hot air convection type drier at 110° C. for 10 minutes to remove the solvent whereby a photosensitive resin material containing phosphor was formed. The thickness of the resulting photosensitive resin material containing phosphors was 50 μm.

Then, on the photosensitive resin material containing phosphors, a polyethylene film with a thickness of 25 μm was further laminated as a cover film to prepare a photosensitive element (ii).

Preparation Example 4

(Preparation of Solution (D-3) for photosensitive resin composition containing phosphor)

In Preparation example 2, the same procedure was repeated except for changing the materials shown in Table 2 with those shown in Table 4, to prepare Solution (D-3) for a photosensitive resin composition containing a phosphor.

TABLE 4

| Material | Formulated amount |
|---|---|
| Solution (d-1) of film property providing polymer obtained in Preparation example 1 | 132 parts by weight (solid content: 60 parts by weight) |
| Polypropylene glycol dimethacrylate (average number of propylene oxide: 12) | 40 parts by weight |
| 2-Benzyl-2-dimethylamino-1-(4-morpholino-phenyl)-butanone-1 | 1 parts by weight |
| (Y,Gd)$BO_3$: Eu (Red phosphor) | 212 parts by weight |
| Methyl ethyl ketone | 30 parts by weight |

Solution (D-3) for a photosensitive resin composition layer containing a phosphor obtained in Preparation example 4 was uniformly coated on the surface of a polyethylene-terephthalate film with a thickness of 20 μm, and dried with a hot air convection type drier at 110° C. for 10 minutes to remove the solvent whereby a photosensitive resin material containing phosphor was formed. The thickness of the resulting photosensitive resin material containing phosphors was 50 μm.

Then, on the photosensitive resin material containing phosphors, a polyethylene film with a thickness of 25 μm was further laminated as a cover film to prepare a photosensitive element (iii).

Preparation Example 5

At the side at which barrier ribs are formed on a substrate for PDP (stripe shaped barrier ribs, opening width between barrier ribs: 140 μm, width of barrier ribs: 70 μm, and a height of barrier ribs: 140 μm), the photosensitive element (i) obtained in Preparation example 2 was laminated by peeling off the polyethylene film by using a vacuum laminater (available from Hitachi Chemical Co., Ltd., trade name: VLM-1 Type) at a heat shoe temperature of 30° C., a laminating rate of 1.5 m/min, a pressure of 4000 Pa or less and an adhering pressure (cylinder pressure) of $5\times10^4$ Pa (since a substrate with a thickness of 3 mm, and a length of 10 cm and a width of 10 cm was used, a line pressure at this time was $2.4\times10^3$ N/m).

Next, the polyethylene terephthalate film of the photosensitive element at the side which is not in contact with the barrier ribs was peeled off. On the photosensitive layer containing a phosphor, an embedding layer comprising a polyethylene terephthalate film with a film thickness of 100 μm (Vicat softening point: 82 to 100° C.) was contacted and pressed by using a laminater (available from Hitachi Chemical Co., Ltd., trade name: HLM-3000 Type) at a laminating temperature of 70° C., a laminating rate of 0.5 m/min and an adhering pressure (cylinder pressure) of $4\times10^5$ Pa (since a substrate with a thickness of 3 mm, and a length of 10 cm and a width of 10 cm was used, a line pressure at this time was $9.8\times10^3$ N/m) to press the embedding layer whereby the photosensitive resin composition containing a phosphor and the embedding layer were embedded in the space surrounded by the barrier rib wall surfaces and the bottom surface of the substrate.

Then, an adhesive tape was adhered to the polyethylene film with a thickness of 100 μm which is an embedding layer and the embedding layer was physically peeled off.

Next, to the surface of the photosensitive element (i) which is not in contact with the barrier ribs, a photomask for a test is adhered and an active light was imagewisely irradiated with 500 mJ/$cm^2$ by using HMW-590 type exposure machine (trade name, available from ORC Seisakusho) to prepare a photocured pattern (G).

Preparation Example 6

In the same manner as in Preparation example 5 except for changing the photosensitive element (i) prepared in Preparation example 2 to the photosensitive element (ii) prepared in Preparation example 3, a photocured pattern (H) was prepared.

Preparation Example 7

In the same manner as in Preparation example 5 except for changing the photosensitive element (i) prepared in Preparation example 2 to the photosensitive element (iii) prepared in Preparation example 4, a photocured pattern (J) was prepared.

Example 1

The above-mentioned pattern (G) was subjected to spray development at 30° C. for 70 seconds by using a 1% by weight sodium carbonate aqueous solution, and then subjected to dipping by rocking at 30° C. for 10 minutes by using a 1% by weight malonic acid aqueous solution to prepare a phosphor pattern precursor (G-1). Then, the phosphor pattern precursor (G-1) was elevated at a temperature raising rate of 2° C./min in an electric furnace and heat treatment (calcination) was carried out at 450° C. for one hour to obtain a phosphor pattern (G-1').

The resulting phosphor pattern (G-1') was scraped away to make a sample, and the sample (hereinafter merely referred to as "phosphor pattern (G-1')") was examined as mentioned below (other samples of Examples and Comparative examples are also examined in the same manner).

The contents of an alkali metal or an alkaline earth metal of the phosphor pattern (G-1') were analyzed by the atomic-absorption spectroscopy (ICP) and the results are shown in Table 4.

Also, the phosphor pattern (G-1') was filled in a concave portion of a stainless plate having the concave portion (diameter: 2 cm, depth: 1 mm). Next, by using a microfluorometer (available from Bunko Keiki Co.), chromaticity was measured. Moreover, a color difference was measured by using an untreated (no operation was applied) blue-phosphor as a standard, and the results are shown in Table 7. At this time, a wavelength which excites the phosphor pattern was made 254 nm.

Comparative Example 1

In the same manner as in Example 1 except not subjecting to acid treatment by using a 1% by weight malonic acid aqueous solution, a phosphor pattern (GG-1') was prepared. The contents of an alkali metal or an alkaline earth metal of the resulting phosphor pattern (GG-1') are shown in Table 4. Also, chromaticity of the phosphor pattern at this time is shown in Table 7. Further, a color difference was measured by using an untreated blue phosphor as a standard.

Example 2

In the same manner as in Example 1 except for replacing a 1% by weight malonic acid aqueous solution with a 5% by weight benzyltriethylammonium chloride aqueous solution, a phosphor pattern (G-2') was prepared. The contents of an alkali metal or an alkaline earth metal of the resulting phosphor pattern (G-2') are shown in Table 4. Also, chromaticity of the phosphor pattern at this time is shown in Table 7. Further, a color difference was measured by using an untreated blue phosphor as a standard.

Example 3

In the same manner as in Comparative example 1 except for replacing a 1% by weight sodium carbonate aqueous solution with a 1% by weight tetramethylammonium hydroxide aqueous solution and effecting spray development for 15 second, a phosphor pattern (G-3') was prepared. The contents of an alkali metal or an alkaline earth metal of the resulting phosphor pattern (G-3') are shown in Table 4. Also, chromaticity of the phosphor pattern at this time is shown in Table 7. Further, a color difference was measured by using an untreated blue phosphor as a standard.

Example 4

In the same manner as in Example 3 except for replacing a 1% by weight tetramethylammonium hydroxide aqueous solution with an emulsion liquor comprising 3-methyl-3-methoxybutyl acetate and water (20/80 (weight ratio)) and effecting spray development for 100 seconds, a phosphor pattern (G-4') was prepared. The contents of an alkali metal or an alkaline earth metal of the resulting phosphor pattern (G-4') are shown in Table 4. Also, chromaticity of the phosphor pattern at this time is shown in Table 7. Further, a color difference was measured by using an untreated blue phosphor as a standard.

Example 5

The above-mentioned pattern (H) was subjected to spray development at 30° C. for 70 seconds by using a 1% by weight sodium carbonate aqueous solution, and then subjected to dipping by rocking at 30° C. for 10 minutes by using a 1% by weight malonic acid aqueous solution to prepare a phosphor pattern precursor (H-1). Then, the phosphor pattern precursor (H-1) was elevated at a temperature raising rate of 2° C./min in an electric furnace and heat treatment (calcination) was carried out at 450° C. for one hour to obtain a phosphor pattern (H-1'). Then, the phosphor pattern (H-1') was removed from barrier ribs.

The contents of an alkali metal or an alkaline earth metal of the phosphor pattern (H-1') are shown in Table 5.

Also, the phosphor pattern (H-1') was filled in a concave portion of a stainless plate having the concave portion (diameter: 2 cm, depth: 1 mm). Next, by using a luminometer (available from Topkon Co.), emission luminance of the phosphor pattern (H-1') was measured. In the same manner, emission luminance of an untreated green phosphor was also measured. At this time, wavelengths which excite the phosphor pattern were made 147 nm, 172 nm and 254 nm. Moreover, a relative emission luminance (%) of the phosphor pattern (H-1') when an emission luminance of the untreated green phosphor was made 100, and the results are shown in Table 8 (other Examples and Comparative examples were also measured in the same manner).

Comparative Example 2

In the same manner as in Example 4 except for not subjecting to acid treatment by using a 1% by weight malonic acid aqueous solution, a phosphor pattern (HH-1') was prepared. The contents of an alkali metal or an alkaline earth metal of the resulting phosphor pattern (HH-1') are shown in Table 5. Also, a relative emission luminance (%) of the phosphor pattern (HH-1') when the emission luminance of the untreated green phosphor was made 100 was measured and the results are shown in Table 8.

Example 6

In the same manner as in Example 5 except for replacing a 1% by weight malonic acid aqueous solution with a 5% by weight benzyltriethylammonium chloride aqueous solution, a phosphor pattern (H-2') was prepared. The contents of an alkali metal or an alkaline earth metal of the resulting phosphor pattern (H-2') are shown in Table 5. Also, a relative emission luminance (%) of the phosphor pattern (H-2') when the emission luminance of the untreated green phosphor was made 100 was measured and the results are shown in Table 8.

Example 7

In the same manner as in Comparative example 2 except for replacing a 1% by weight sodium carbonate aqueous solution with a 1% by weight tetramethylammonium hydroxide aqueous solution and effecting spray development for 15 second, a phosphor pattern (H-3') was prepared. The contents of an alkali metal or an alkaline earth metal of the resulting phosphor pattern (H-3') are shown in Table 5. Also, a relative emission luminance (%) of the phosphor pattern (H-3') when the emission luminance of the untreated green phosphor was made 100 was measured and the results are shown in Table 8.

Example 8

In the same manner as in Example 7 except for replacing a 1% by weight tetramethylammonium hydroxide aqueous solution with an emulsion liquor comprising 3-methyl-3-methoxybutyl acetate and water (20/80 (weight ratio)) and effecting spray development for 100 seconds, a phosphor pattern (H-4') was prepared. The contents of an alkali metal or an alkaline earth metal of the resulting phosphor pattern (H-4') are shown in Table 5. Also, a relative emission luminance (%) of the phosphor pattern (H-4') when the emission luminance of the untreated green phosphor was made 100 was measured and the results are shown in Table 8.

Example 9

The above-mentioned pattern (J) was subjected to spray development at 30° C. for 70 seconds by using a 1% by weight sodium carbonate aqueous solution, and then subjected to dipping by rocking at 30° C. for 10 minutes by using a 1% by weight malonic acid aqueous solution to prepare a phosphor pattern precursor (J-1). Then, the phosphor pattern precursor (J-1) was elevated at a temperature raising rate of 2° C./sec in an electric furnace and heat treatment (calcination) was carried out at 450° C. for one hour to obtain a phosphor pattern (J-1'). Then, the phosphor pattern (J-1) was removed from barrier ribs.

The contents of an alkali metal or an alkaline earth metal of the phosphor pattern (J-1') are shown in Table 6.

Also, emission luminance of the phosphor pattern (J-1') and that of the untreated red phosphor were measured and a relative emission luminance (%) of the phosphor pattern (J-1') when an emission luminance of the untreated red phosphor was made 100 was obtained, and the results are shown in Table 9.

Comparative Example 3

In the same manner as in Example 9 except for not subjecting to acid treatment by using a 1% by weight malonic acid aqueous solution, a phosphor pattern (JJ-1') was prepared. The contents of an alkali metal or an alkaline earth metal of the resulting phosphor pattern (JJ-1) are shown in Table 6. Also, a relative emission luminance (%) of the phosphor pattern (JJ-1') when the emission luminance of the untreated red phosphor was made 100 was measured and the results are shown in Table 9.

Example 10

In the same manner as in Example 9 except for replacing a 1% by weight malonic acid aqueous solution with a 5% by weight benzyltriethylammonium chloride aqueous solution, a phosphor pattern (J-2') was prepared. The contents of an alkali metal or an alkaline earth metal of the resulting phosphor pattern (J-2') are shown in Table 6. Also, a relative emission luminance (%) of the phosphor pattern (J-2') when the emission luminance of the untreated red phosphor was made 100 was measured and the results are shown in Table 9.

Example 11

In the same manner as in Comparative example 3 except for replacing a 1% by weight sodium carbonate aqueous solution with a 1% by weight tetramethylammonium hydroxide aqueous solution and effecting spray development for 15 second, a phosphor pattern (J-3') was prepared. The contents of an alkali metal or an alkaline earth metal of the resulting phosphor pattern (J-3') are shown in Table 6. Also, a relative emission luminance (%) of the phosphor pattern (J-3') when the emission luminance of the untreated red phosphor was made 100 was measured and the results are shown in Table 9.

Example 12

In the same manner as in Example 7 except for replacing a 1% by weight tetramethylammonium hydroxide aqueous solution with an emulsion liquor comprising 3-methyl-3-methoxybutyl acetate and water (20/80 (weight ratio)) and effecting spray development for 100 seconds, a phosphor pattern (J-4') was prepared. The contents of an alkali metal or an alkaline earth metal of the resulting phosphor pattern (J-4') are shown in Table 6. Also, a relative emission luminance (%) of the phosphor pattern (J-4') when the emission luminance of the untreated red phosphor was made 100 was measured and the results are shown in Table 9.

TABLE 4

| | Phosphor | Sodium content (mg) | Sodium content (% by weight) |
|---|---|---|---|
| Standard | Blue phosphor | 0.001 | 0.0001 |
| Example 1 | G-1' | 0.8 | 0.08 |
| Example 2 | G-2' | 0.2 | 0.02 |
| Example 3 | G-3' | 0.1 | 0.01 |
| Example 4 | G-4' | 0.1 | 0.01 |
| Comparative example 1 | GG-1' | 97 | 9.7 |

TABLE 5

| | Phosphor | Sodium content (mg) | Sodium content (% by weight) |
|---|---|---|---|
| Standard | Green phosphor | 0.009 | 0.0009 |
| Example 5 | H-1' | 0.4 | 0.04 |
| Example 6 | H-2' | 0.3 | 0.03 |
| Example 7 | H-3' | 0.15 | 0.015 |
| Example 8 | H-4' | 0.1 | 0.01 |
| Comparative example 2 | HH-1' | 95 | 9.5 |

TABLE 6

| | Phosphor | Sodium content (mg) | Sodium content (% by weight) |
|---|---|---|---|
| Standard | Red phosphor | 0.001 | 0.0001 |
| Example 9 | J-1' | 0.2 | 0.02 |
| Example 10 | J-2' | 0.1 | 0.01 |
| Example 11 | J-3' | 0.1 | 0.01 |
| Example 12 | J-4' | 0.1 | 0.01 |
| Comparative example 3 | JJ-1' | 86 | 8.6 |

TABLE 7

| | Phosphor | Chromaticity (CIE regulation) | | Color difference |
|---|---|---|---|---|
| | pattern | x | y | (ΔE) |
| Standard 1 | G' | 0.147 | 0.058 | standard |
| Example 1 | G-1' | 0.145 | 0.059 | 0.003 |
| Example 2 | G-2' | 0.145 | 0.057 | 0.003 |
| Example 3 | G-3' | 0.147 | 0.059 | 0.002 |
| Example 4 | G-4' | 0.145 | 0.060 | 0.005 |
| Comparative example 1 | GG-1' | 0.150 | 0.069 | 0.024 |

TABLE 8

| | | Relative emission luminance (%) | | |
|---|---|---|---|---|
| | Phosphor | Excited at 147 nm | Excited at 172 nm | Excited at 254 nm |
| Standard | Green phosphor | 100 | 100 | 100 |
| Example 5 | H-1' | 94 | 92 | 90 |
| Example 6 | H-2' | 94 | 92 | 91 |
| Example 7 | H-3' | 94 | 92 | 94 |
| Example 8 | H-4' | 99 | 100 | 100 |
| Comparative example 2 | HH-1' | 84 | 89 | 77 |

TABLE 9

| | | Relative emission luminance (%) | | |
|---|---|---|---|---|
| | Phosphor | Excited at 147 nm | Excited at 172 nm | Excited at 254 nm |
| Standard | Red phosphor | 100 | 100 | 100 |
| Example 9 | J-1' | 98 | 100 | 99 |
| Example 10 | J-2' | 100 | 100 | 99 |

TABLE 9-continued

| | | Relative emission luminance (%) | | |
|---|---|---|---|---|
| | Phosphor | Excited at 147 nm | Excited at 172 nm | Excited at 254 nm |
| Example 11 | J-3' | 99 | 99 | 100 |
| Example 12 | J-4' | 100 | 98 | 99 |
| Comparative example 3 | JJ-1' | 84 | 81 | 80 |

In Table 4, any alkali metal or alkaline earth metal other than sodium was detected.

From the results shown in Table 4 and Table 7, it can be understood that in Comparative example 1, the content of sodium in the phosphor pattern (the content of sodium contained in 1 g of the phosphor) exceeds 20 mg, chromaticity was markedly changed (it was shown the value which exceeds the color difference of 0.010 or more). On the other hand, in Examples 1 to 4, when the content of sodium in the phosphor pattern (the content of sodium contained in 1 g of the phosphor) was made 20 mg or less, chromaticity of the phosphor after calcination was not changed.

From the results shown in Table 5 and Table 8, it can be understood that in Examples 5 to 8, the contents of sodium in the phosphor pattern (the content of sodium contained in 1 g of the phosphor) were made 20 mg or less, emission luminances of the phosphors after calcination were not lowered as compared with the results of the standard 2. However, in Comparative example 2, when the content of sodium in the phosphor pattern (the content of sodium contained in 1 g of the phosphor) exceeds 20 mg, emission luminance of the phosphor after calcination was lowered (10% or more based on the standard).

From the results shown in Table 6 and Table 9, it can be understood that in Examples 9 to 12, the contents of sodium in the phosphor pattern (the content of sodium contained in 1 g of the phosphor) were made 20 mg or less, emission luminances of the phosphors after calcination were not lowered as compared with the results of the standard 3. However, in Comparative example 3, when the content of sodium in the phosphor pattern (the content of sodium contained in 1 g of the phosphor) exceeds 20 mg, emission luminance of the phosphor after calcination was lowered (10% or more based on the standard).

According to the process for preparing the phosphor pattern of the present invention, a phosphor pattern with less change in emission characteristics can be produced with good yield.

According to the organic alkali developer or the emulsion developer for forming a phosphor pattern of the present invention, a phosphor pattern with less change in emission characteristics can be produced with good yield.

The phosphor pattern of the present invention has less change in emission characteristics.

The back plate for a plasma display panel of the present invention is provided with a phosphor pattern which is less change in emmision characteristics.

What is claimed is:

1. A phosphor pattern which comprises a calcination product of a phosphor pattern precursor containing (A) an organic material containing at least one selected from the group consisting of an alkali metal and an alkaline earth metal; and (B) a phosphor wherein an amount of the alkali metal or the alkaline earth metal is 2% by weight or less based on the amount of (B) the phosphor.

2. A back plate for a plasma display panel provided with the phosphor pattern according to claim 1 on the substrate for the plasma display panel.

* * * * *